United States Patent
Surdeanu et al.

(10) Patent No.: US 9,939,141 B2
(45) Date of Patent: Apr. 10, 2018

(54) ACTIVE THERMAL MANAGEMENT DEVICE AND THERMAL MANAGEMENT METHOD

(75) Inventors: Radu Surdeanu, Roosbeek (BE); Damien Lenoble, Eprave (BE)

(73) Assignee: NXP B.V., Eindhoven (NL)

( * ) Notice: Subject to any disclaimer, the term of this patent is extended or adjusted under 35 U.S.C. 154(b) by 1461 days.

(21) Appl. No.: 13/424,848

(22) Filed: Mar. 20, 2012

(65) Prior Publication Data
US 2012/0247707 A1     Oct. 4, 2012

(30) Foreign Application Priority Data
Mar. 30, 2011   (EP) ..................... 11160459

(51) Int. Cl.
*F28D 17/00* (2006.01)
*F24D 11/00* (2006.01)
(Continued)

(52) U.S. Cl.
CPC .............. *F21V 29/54* (2015.01); *F21S 2/005* (2013.01); *F21V 29/00* (2013.01); *F21V 29/004* (2013.01); *H01L 23/427* (2013.01); *H01L 23/4275* (2013.01); *F21V 29/50* (2015.01); *F21V 29/51* (2015.01); *F21V 29/71* (2015.01); *F21Y 2115/10* (2016.08); *F28D 20/02* (2013.01); *F28D 2021/0029* (2013.01); *F28F 2013/008* (2013.01); *H01L 33/62* (2013.01); *H01L 2924/0002* (2013.01)

(58) Field of Classification Search
CPC ........ F28D 19/00; F21V 29/00; F21V 29/004; F21V 29/54; F21S 2/005
USPC .................................................. 165/10, 236
See application file for complete search history.

(56) References Cited

U.S. PATENT DOCUMENTS

| 3,650,117 A | 3/1972 | Robinson et al. |
| 5,605,048 A | 2/1997 | Kozlov et al. |

(Continued)

FOREIGN PATENT DOCUMENTS

| WO | 03/019093 A1 | 3/2003 |
| WO | WO 03019093 A1 * | 3/2003 |
| WO | 2006/056809 A1 | 6/2006 |

OTHER PUBLICATIONS

Extended European Search Report for European Patent Appln. No. 11160459.1 (dated Sep. 6, 2011).

*Primary Examiner* — Len Tran
*Assistant Examiner* — Paul Alvare

(57) ABSTRACT

An active thermal management device and method, in which a phase change material unit, comprising at least one phase change material arranged in series or parallel, is connectable to a source of thermal energy, such as LEDs at a first operating condition. Thermal energy from the source of thermal energy is stored in the phase change material unit. The phase change material unit is connectable to a sink of thermal energy, such as second LEDs at a second operating condition. The thermal energy stored in the phase change material unit may be re-used. The first operating condition can include a 15V supply voltage, and the second operating condition can include either no supply voltage, or a lower 9V supply voltage of 9V, such that heat from the first LEDs, which may be over-temperature, can pre-heat the second LEDs, improving thermal and optical matching.

5 Claims, 2 Drawing Sheets

(51) Int. Cl.
    *F28D 20/00*     (2006.01)
    *F21V 29/54*     (2015.01)
    *F21S 2/00*     (2016.01)
    *F21V 29/00*     (2015.01)
    *H01L 23/427*     (2006.01)
    *F28D 20/02*     (2006.01)
    *H01L 33/62*     (2010.01)
    *F28F 13/00*     (2006.01)
    *F28D 21/00*     (2006.01)
    *F21V 29/50*     (2015.01)
    *F21V 29/51*     (2015.01)
    *F21V 29/71*     (2015.01)
    *F21Y 115/10*     (2016.01)

(56) References Cited

U.S. PATENT DOCUMENTS

| | | | | |
|---|---|---|---|---|
| 5,713,208 | A * | 2/1998 | Chen et al. | 62/3.7 |
| 5,867,990 | A | 2/1999 | Ghoshal | |
| 5,966,941 | A * | 10/1999 | Ghoshal | 62/3.7 |
| 6,161,388 | A * | 12/2000 | Ghoshal | 62/3.7 |
| 6,222,113 | B1 * | 4/2001 | Ghoshal | 136/201 |
| 6,239,502 | B1 * | 5/2001 | Grewe et al. | 290/1 B |
| 6,452,217 | B1 * | 9/2002 | Wojnarowski et al. | 257/99 |
| 6,631,755 | B1 * | 10/2003 | Kung et al. | 165/46 |
| 6,639,242 | B1 | 10/2003 | Chen et al. | |
| 6,652,770 | B2 | 11/2003 | Hayes | |
| 6,668,819 | B1 * | 12/2003 | Remsburg | 126/633 |
| 6,794,749 | B2 | 9/2004 | Akram | |
| 7,002,800 | B2 | 2/2006 | Elias et al. | |
| 7,019,971 | B2 | 3/2006 | Houle et al. | |
| 7,100,381 | B2 | 9/2006 | Hale et al. | |
| 7,104,080 | B2 | 9/2006 | Albertson | |
| 7,111,465 | B2 | 9/2006 | Bell | |
| 7,204,298 | B2 | 4/2007 | Hodes et al. | |
| 7,235,735 | B2 | 6/2007 | Venkatasubramanian et al. | |
| 7,253,523 | B2 | 8/2007 | Dani et al. | |
| 7,307,841 | B2 | 12/2007 | Berlin et al. | |
| 7,358,649 | B2 | 4/2008 | Scher et al. | |
| 2003/0221812 | A1 | 12/2003 | Hsiao et al. | |
| 2005/0099776 | A1 | 5/2005 | Xue et al. | |
| 2009/0219726 | A1 * | 9/2009 | Weaver et al. | 362/373 |

\* cited by examiner

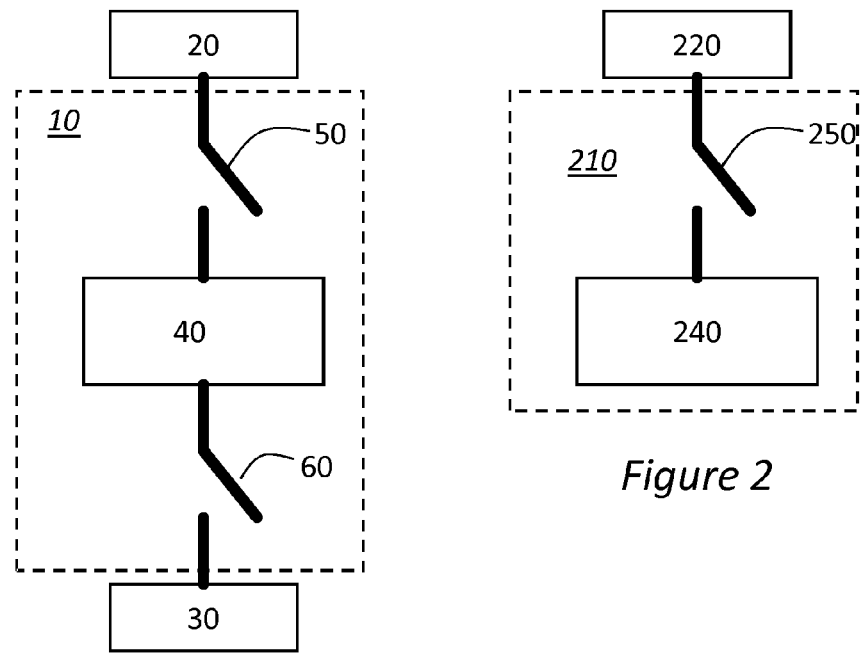
Figure 1
Figure 2
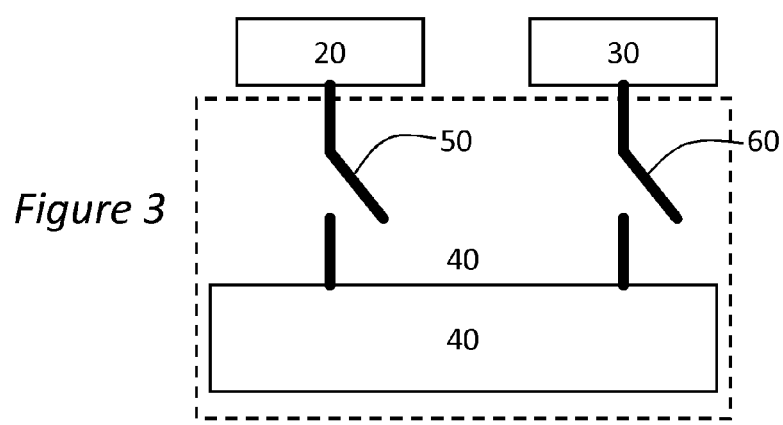
Figure 3

ACTIVE THERMAL MANAGEMENT DEVICE AND THERMAL MANAGEMENT METHOD

This application claims the priority under 35 U.S.C. § 119 of European patent application no. 11160459.1, filed on Mar. 30, 2011, the contents of which are incorporated by reference herein.

FIELD

This invention relates to active thermal management devices and thermal management methods.

BACKGROUND

Thermal management of microelectronic devices and circuits is well-known. For many decades heat-sinks have been attached to electronic components in order to dissipate excess heat which is produced within the component. Both the performance and a lifetime of many electronic components deteriorate with increased temperature operation, and absent a suitable means to dissipate excess heat, the operating temperature of many such electronic components would be undesirably high. This applies not only to microelectronic components but also to optoelectronic components such as LEDs, lasers etc.

A conventional heatsink operates by radiating and/or conducting heat away from the electronic component or components to be cooled. The electronic component is thus a source of thermal energy. Such heatsinks may be termed passive thermal management systems. Active thermal management systems are also known; a simple example of an active thermal management system is forced air cooling, for instance by means of a fan. Another more advanced form of active thermal management is by use of thermoelectric coolers such as Peltier coolers. Since the thermoelectric cooler can be controlled, the rate of heat dissipation of from the electronic components may be controlled.

Inclusion of phase change material in a cooling system is known and is described for instance in U.S. Pat. No. 7,104,080.

SUMMARY

According to a first aspect there is provided an active thermal management device comprising a phase change material unit configured to store thermal energy, a switch configured to thermally connect the phase change material unit with a source of thermal energy, and a further switch configured to thermal connect the phase change material unit to a sink of thermal energy.

By providing a switch to connect the phase change material unit with the source of thermal energy, the unit may act as a thermal store. That is to say, heat may be transferred, over a period, which may be predetermined or may be arbitrary, from the source of thermal energy to be unit. The heat energy which is still in the unit may later be either reused or dissipated by connecting the phase change material unit to the sink of thermal energy. Typically the further switch will be different from the switch; however, in some embodiments, the same device may comprise the switch and the further switch. In such embodiments, the thermal energy may be stored for a period of time in the phase change material unit, and then be returned to the same component which originally acted as a source of thermal energy, but now has a lower temperature and thus acts as a sink of thermal energy.

In embodiments, the active thermal management device further comprises a yet further switch configured to thermally connect the phase change material unit to a heat sink. "Heat sink" is used herein to refer to a conventional heatsink which may be, for instance, a highly conductive metal component and which may be assisted by forced air cooling or by a thermoelectric cooling, whilst in contrast, by "sink of thermal energy" carries a broader meaning, to include, without limitation, both conventional heatsinks, and components which receive heat as an input, for instance to achieve a desired operating temperature, or in order to scavenge electrical energy from the thermal energy. Such embodiments may thus enable either or both of re-use of the thermal energy stored in the unit, or its dissipation by means of the heatsink.

In embodiments, at least one of the switch and the further switch is a microelectronic mechanical switch. A microelectronic mechanical switch (MEMS) is a form of mechanical switch, which can provide for selective but efficient heat transfer to and from the phase change material unit.

In embodiments, the active thermal management device further comprises a first group of lighting emitting diodes (LEDs) operable as the source of thermal energy. Light emitting diodes are particularly sensitive to operating temperature. Both their operating characteristics, such as efficiency and optical output including brightness and wavelength, and their lifetime, depend on their operating temperature, so it is useful to appropriately control the temperature. In general the higher the operating temperature, the worse their performance characteristics and the shorter their lifetime. As used herein, the term "group" encompasses both a singular LED and a plurality of LEDs.

In embodiments, the active thermal management device further comprises a second group of lighting emitting diodes operable as the sink of thermal energy. The thermal energy transferred from the phase change material unit to the second group of LEDs may thus be used to heat this second group of LEDs up to a temperature at which is closer to the temperature of the first group of LEDs, than would otherwise be the case. This can be particularly convenient in order to match the output characteristics of the second group of LEDs to those of the first group of LEDs, for instance in situations in which the first group of LEDs are about to be switched off, and the second group of LEDs are about to be switched on, as will be discussed in more detail below In embodiments, the second group of lighting emitting diodes is different from the first group of light emitting diodes. However, the invention is not limited thereto, and the second group of LEDs may be the same group as the first group of LEDs, for instance, were the first group of LEDs have been switched off for a temporary period during which the thermal energy is stored in the phase change material unit, and then the first group of LEDs are switched back on.

In embodiments, the phase change material unit comprises a plurality of phase change materials, each phase change material having a different phase transition temperature. Since each phase change material or undergoes its phase change at a specific temperature or temperature range, such a unit can be used to source of thermal energy at more than one temperature or temperature range According to another aspect, there is provided a method of thermal management comprising: thermally connecting a source of thermal energy to a phase change material unit, transferring thermal energy to the phase change material unit from the source of thermal energy, disconnecting the source of thermal energy to a phase change material unit, storing the transferred thermal energy in the phase change material unit, thermal connecting a sink of thermal energy to the phase change energy unit, and transferring thermal energy from the phase change material unit to the sink of thermal energy.

In embodiments, the method further comprises thermally connecting the phase change material unit to a heat sink and transferring excess thermal energy from the phase change material unit to the heat-sink.

In embodiments, at least one of thermally connecting a source of thermal energy to a phase change material unit and thermal connecting a sink of thermal energy to the phase change energy unit is by means of a microelectronic mechanical switch.

In embodiments, the source of thermal energy comprises a first group of LEDs operating under a first set of operating conditions. The sink of thermal energy may comprise a second group of LEDs operating under a second set of operating conditions.

In embodiments, the first set of operating conditions includes a first operating voltage, the second set of operating conditions includes a second operating voltage, and the first operating voltage is lower than the second operating voltage.

In embodiments the first set of operating conditions includes a first operating temperature, the second set of operating conditions includes a second operating temperature, and wherein the first operating temperature is higher than the second operating temperature.

These and other aspects will be apparent from and elucidated with reference to, the embodiments described hereinafter.

BRIEF DESCRIPTION OF DRAWINGS

Embodiments of the invention will be described, by way of example only, with reference to the drawings, in which FIG. 1 is a schematic of a first active thermal management system;

FIG. 2 is a schematic of an alternative active thermal management system wherein heat is recycled;

FIG. 3 is a schematic of a further active thermal management system;

Figure 4:
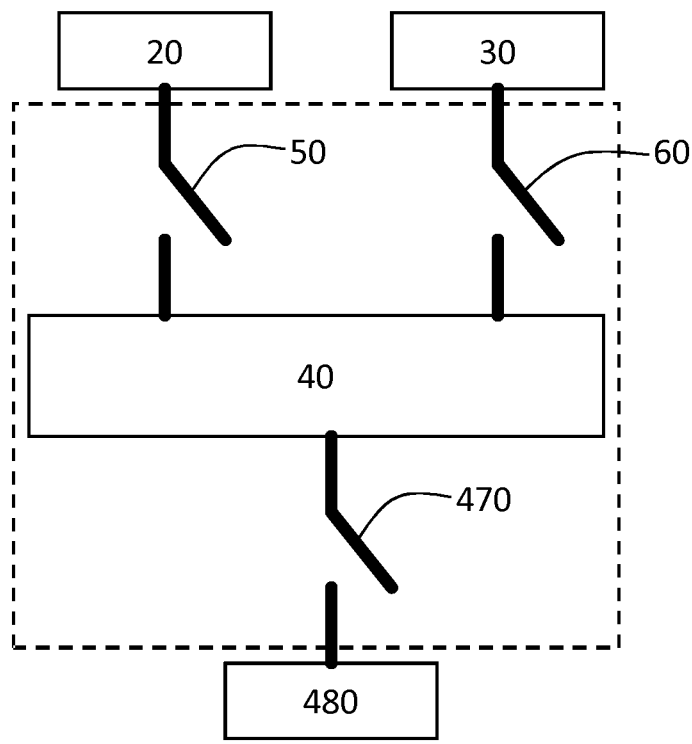
FIG. 4 is a schematic of a yet further active thermal management system, further comprising a conventional heatsink.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments

DETAILED DESCRIPTION OF EMBODIMENTS

FIG. 1 is a schematic of a first active thermal management system. The system comprises an active thermal management device 10, which is situated between a source of thermal energy 20 and a sink of thermal energy 30. The active thermal management device 10 comprises a phase change material unit 40, together with two switches 50 and 60. Switch 50 is arranged between the phase change material unit 40 the source of thermal energy 20; switch 60 is arranged between the phase change material unit 40 and the sink of thermal energy 30. The switches are thermal switches—that is to say, they provide a switchable or selectable thermal path between the phase change material unit 40 and the respective source of sink of thermal energy. When the switch is closed, there is a thermal path by which thermal energy and transferred between the respective source of sink of thermal energy and the phase change material unit 40; when the switch is open the thermal path is broken. In other words the closed switch provides thermal short, or a thermal path with the low thermal resistance; whilst when the switch is open there is no such thermal path: rather, the switch provides a high of thermal resistance.

Although the invention is not limited thereto, MEMS devices provide particularly suitable switches. MEMs switches are switches which are typically implemented based on silicon materials and take advantage of the multi-billion dollar investment in semiconductor processing. Semiconductor process technology is widely known to span materials which are extremely good thermal conductors, such as copper, to materials which are extremely good thermal insulators, such as dielectric materials SiOx, SiN and so-called "high-k" materials such as HfO2. MEMS switches typically employ standard, or near standard, semi-conductor process technology, together with so-called "release layers" which are removed in order that the device may have some mechanical degree of freedom to move. A MEMs thermal switch is configured, such as will be well known to the skilled person, so that when the switch is closed there is a good thermal path between the input and output, and when the switch is opened there is only a poor thermal path, including a heat so-called thermal break, which may typically be an air gap. MEMs being a micro-electro mechanical system, if one puts enough current through the MEMS device, parts of the device will physically move. This movement can be arranged such that it touches different elements, such as heatsinks.

The phase change material unit 40 comprises at least one section of a phase change material. As will be well known to the skilled person, a phase change material undergoes a change of phase at a specific temperature or over a specific temperature range. Since thermal energy is required to effect the phase change, the phase change material can act as a thermal store: supplying a first quantity of thermal energy, by placing the phase change material in thermal contact with a hotter body, can effect the change from a first phase to a second phase, and store in the PCM the latent energy corresponding to the energy required to effect the phase change; if the PCM is then brought into contact with a cooler body, the stored latent energy may be released by effecting the phase change back from the second phase to the first phase.

Well-known examples of phase change materials include paraffins, such as eicosane, docosane in which the phase transitions are between a solid and liquid phase, take place at temperature ranges between −10 and 70° C., and involve a latent heat of between 120 and 200 J/cc. Eutectic metallics, such as Bi—Cd—In also involve a solid to a liquid phase transition, which take effect over a temperature ranges of 30-125° C., and have latent heats of 200 to 800 J/cc. Solid-to-solid phase transition materials, such as solid organic compounds, are also known; these may be particularly suitable due to the convenience of their packaging.

In use, phase change material unit 40 is connected to the source of thermal energy by means of switch 50. Thermal energy is transferred from the source 20 to phase change material unit 40, which undergoes a phase transition and thereby stores the transferred thermal energy. Switch 50 is then opened to disconnect the phase change material unit 40 from the source of thermal energy. Either immediately, or at a later time, switch 60, which had been in an open state, is closed, in order to thermally connect the phase change material unit 40 to the sink of thermal energy at 30. Provided that the temperature of the sink of thermal energy 30 is lower than the phase transition temperature of the PCM, the thermal energy which was stored as latent heat in the PCM is released by the inverse phase transition and transferred to the sink of thermal energy 30.

FIG. 2 is a schematic of an alternative active thermal management system wherein heat is recycled. This system comprises an active thermal management device 210, which includes a phase change material unit 40, and a single switch 250. The active thermal management device is arranged adjacent a source of thermal energy at 220, which also acts as a sink of thermal energy. During a first phase of operation, the single switch 250 connects the phase change material unit 240 with the source of thermal energy. Heat is removed from the source of thermal energy 220, and stored in the phase change material unit 240, thereby cooling the source of thermal energy. In the non-limiting example in which the source of thermal energy is a group of LEDs, which will be discussed in more detail below, the operating temperature of the LEDs may thereby be limited. During a second phase of operation, the phase change material unit 240 is isolated from the source of thermal energy. The source of thermal energy 220 cools down further. In the specific example just mentioned, the LEDs may be switched off during this period. During a third phase operation, the thermal energy which is stored in the phase change material unit 240 is required to heat up the original source of thermal energy 220, and so the switch is a re-closed to reconnect the PCM unit to the source of thermal energy 220. Provided that it is at a lower temperature than the phase transition temperature of the PCM unit, heat is transferred back to the original source 220 which is now acting as a sink of thermal energy. In the specific example cited, this may correspond to preheating the LEDs which have cooled to a temperature below the phase transition temperature, prior to switching the LEDs back on. The temperature difference between the moment of switch off of the LEDs and the moment is switching them back on is thus less than would otherwise be the case. Since the optical output and in particular the output wavelength of an LED is dependant on its operating temperature, the observable colour shift between switch off and switch on may thereby be reduced.

FIG. 3 is a schematic of a further active thermal management system. This arrangement is similar to that shown in FIG. 1; however in this arrangement, the source of thermal energy 20 and the sink of thermal energy 30 are arranged near to each other, and may be interchangeable. Heat may be transferred in either direction through either of these thermal switches 50 and 60.

FIG. 4 is a schematic of a yet further active thermal management system, further comprising a conventional heatsink. This arrangement is similar to that shown in FIG. 3. However, in this arrangement, the active thermal management device includes a further switch 470, which it is arranged between the phase change material unit 40 and a further sink of thermal energy 480. In this example, the further sink of thermal energy 480 is a conventional heatsink; the conventional heatsink may include active cooling by means of forced-air cooling such as a fan, thermoelectric cooling such as a Peltier cooler, or other known heat-sink technology.

This example is distinguished from the examples described above in that the thermal energy which is stored in the phase change material unit 40, may be reused by being routed through switch 60 into sink of thermal energy 30, may be dissipated by a means of switch 470 and conventional heatsink 480, or there may be a combination of the two.

Figure 5:
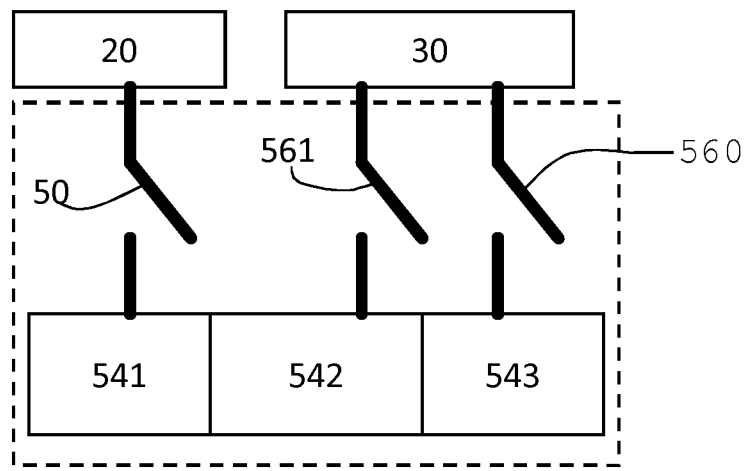
FIG. 5 is a schematic of another active thermal management system, comprising a multi segmented phase change material unit.

FIG. 5 is a schematic of another active thermal management system, comprising a multi-segmented phase change material. As shown, this example is similar to that shown in FIG. 3, however in this case the phase change material unit 540 includes a plurality of phase change materials. Each of the phase change materials 541, 542, 543 may be, for instance, located in a separate segment a sector of the phase change material unit 540. One or more of the different segments may be connected to either or both of the source and sink of thermal energy 20 and 30 respectively. In the non-limiting example shown, the source of thermal energy is connected to the highest temperature segment 541, whilst the sink of thermal energy 30 is connected to the lowest temperature segment 543 and to an intermediate temperature segment 542 by means of switches 560 and 561 respectively. The phase change materials 541, 542 and 543 typically have different phase transition temperatures. An example of a system having a series of phase change materials with a cascading scale of phase transition temperature (Tc) is Ge2Sb2Te5 (Tc=160 C) and Ge4In3Sb67Te26 (Tc=180 C). Changing slightly the composition of this compound will change the transition/critical temperature Tc. It will be immediately appreciated by the skilled person, that the use of a plurality of different phase change materials having a different phase transition temperatures, in conjunction with or separately from such a matrix or other arrangement of multiple switches, provides a very flexible system which is able to reuse heat for many different scenarios.

One example application, relating to LEDs for use as automotive headlights, will now be discussed. LEDs in the headlights are typically driven from a nominal 12V battery. However, when the engine is running, the voltage may be as high as 14V, whilst when the engine is not running at three battery may only be able to supply a voltage of, say, 9V. In order to accommodate this variation in supply voltage, whilst still providing a correct or constant light output, LED fixtures may be formed using several LED segments, and the LED driver may address only a few segments at each time, using for instance time switches. In normal operation, there are instances in which undesirable spikes in the luminous outputs can occur: firstly, during continuous operation, the LEDs become hot and the junction temperature increases so the light output decreases. To compensate for this, the operating current is lowered, allowing the LEDs to cool down. Since the reduction in operating current results in a reduction in luminous outputs, a further segment is switched on. This segment will typically have been "cold". Secondly, when the switching the engine is switched off, the battery may deliver only for instance, 9V, and only a few segments are operational.

Since the junction temperature of the "cold" and "warm" LEDs are very different, to avoid spikes in the luminous outputs, and in particular variations in the output wavelength, a temperature correction is needed.

By using an active thermal management system and device as disclosed herein, the heat generated from the warm LEDs may be transferred back to the cold LEDs, in order to reduce or minimise any variation in the output luminosity and/or colour between adjacent LEDs.

It will be appreciated that devices and systems as disclosed herein may allow for convenient reuse of existing components and circuitry such as temperature sensors mechanical switches, ASICs etc. They may easily be bonded to a source and sink of heat and typically may be inexpensive to implement since they generally do not require aggressive design rules, In the above example has been described with respect to a specific example which relates to for instance automotive headlamps. The skilled prove person will appreciate that the invention is not limited to thereto but in other areas and over other voltage ranges. For instance, with recent developments in automobile Stop-Start systems, the lower voltage may be as low as 3V. In other systems, such as for general lighting applications, the voltage ranges may be either from 0V to 24V or even, for mains power luminaries, up to 240 V and above.

Further non-limiting examples of application to which the present invention relates are that of a microprocessor, or an LED driver, required to operate at elevated temperatures and for each of which it is important to avoid thermal runaway. Another example, which does not relate directly to optical applications, and is thus is illustrative of a broad breadth of application, is thermo-therapy, in which an active thermal management device is used to store energy and then be involved in the delivery of a thermal treatment to a patient.

From reading the present disclosure, other variations and modifications will be apparent to the skilled person. Such variations and modifications may involve equivalent and other features which are already known in the art of thermal management, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. An active thermal management device comprising:
    a phase change material unit configured to store thermal energy;
    a first microelectronic mechanical switch configured to thermally connect the phase change material unit with a first group of lighting emitting diodes operable as a source of thermal energy; and
    a second microelectronic mechanical switch configured to thermally connect the phase change material unit to a second group of lighting emitting diodes operable as a sink of thermal energy;
    wherein the second group of lighting emitting diodes is different from the first group of light emitting diodes.

2. An active thermal management device as claimed claim 1, further comprising: a yet further switch configured to thermally connect the phase change material unit to a heat sink.

3. An active thermal management device as claimed in claim 1, wherein the phase change material unit comprises a plurality of phase change materials, each phase change material having a different phase transition temperature.

4. An active thermal management device as claimed claim 1, further configured to:
    thermally connect the first group of light emitting diodes to the phase change material unit by closing the first microelectronic mechanical switch while the second microelectronic mechanical switch is open, thereby transferring thermal energy to the phase change material unit from the first group of light emitting diodes;
    thermally disconnect the first group of light emitting diodes from the phase change material unit by opening the first microelectronic mechanical switch while the second microelectronic mechanical switch remains open, thereby storing the transferred thermal energy in the phase change material unit; and
    thermally connect the second group of light emitting diodes to the phase change energy unit by closing the second microelectronic mechanical switch while the first microelectronic mechanical switch remains open, thereby transferring thermal energy from the phase change material unit to the second group of light emitting diodes.

5. An active thermal management device as claimed claim 1, further configured to:
    thermally connect the first group of light emitting diodes to the phase change material unit by closing the first microelectronic mechanical switch, thereby transferring thermal energy to the phase change material unit from the first group of light emitting diodes;
    thermally disconnect the first group of light emitting diodes from the phase change material unit by opening the first microelectronic mechanical switch, thereby storing the transferred thermal energy in the phase change material unit; and
    thermally connect the second group of light emitting diodes to the phase change energy unit by closing the second microelectronic mechanical switch, thereby transferring thermal energy from the phase change material unit to the second group of light emitting diodes.

* * * * *